United States Patent
Karasawa et al.

(10) Patent No.: US 7,049,985 B2
(45) Date of Patent: May 23, 2006

(54) METHOD AND CIRCUIT FOR PRODUCING TRIMMED VOLTAGE USING D/A CONVERTER CIRCUIT

(75) Inventors: Yoshiyuki Karasawa, Kyoto (JP); Ichiro Yokomizo, Kyoto (JP); Noboru Kagemoto, Kyoto (JP)

(73) Assignee: Rohm Co., Ltd., (JP)

( * ) Notice: Subject to any disclaimer, the term of this patent is extended or adjusted under 35 U.S.C. 154(b) by 0 days.

(21) Appl. No.: 10/896,341

(22) Filed: Jul. 21, 2004

(65) Prior Publication Data

US 2005/0035890 A1 Feb. 17, 2005

(30) Foreign Application Priority Data

Aug. 12, 2003 (JP) .............................. 2003-292518

(51) Int. Cl.
*H03M 1/10* (2006.01)
(52) U.S. Cl. ...................... 341/121; 341/145; 341/120
(58) Field of Classification Search ................ 341/121, 341/144, 145, 154, 153, 118, 120; 327/525
See application file for complete search history.

(56) References Cited

U.S. PATENT DOCUMENTS

| 4,689,494 | A | * | 8/1987 | Chen et al. | .................. | 327/525 |
| 5,446,407 | A | * | 8/1995 | Yamamoto | .................. | 327/525 |
| 6,307,490 | B1 | * | 10/2001 | Litfin et al. | .................. | 341/121 |

FOREIGN PATENT DOCUMENTS

JP           2000-150799         5/2000

* cited by examiner

*Primary Examiner*—John B Nguyen
(74) *Attorney, Agent, or Firm*—Canton Colburn LLP

(57) ABSTRACT

Trimming by disconnecting a fuse connected in parallel to a feedback resistor of an amplifier circuit would cause a variation in voltage value due to a remaining resistance component. A voltage generator circuit is provided therein with a D/A converter circuit of an R-2R ladder resistor network type circuit. The D/A converter circuit is provided with a first switch circuit to an eighth switch circuit, corresponding to each bit, which are switched to set a digital value. Each switch circuit, which is provided with a fuse for providing a fixed voltage value, allows the fuse to be disconnected to fix the voltage value to a value obtained by inverting the initial value. The setting circuit controls the switching operation of each switch circuit, thereby simulating an electrical state of a fuse being disconnected before the fuse is actually disconnected.

9 Claims, 3 Drawing Sheets

METHOD AND CIRCUIT FOR PRODUCING TRIMMED VOLTAGE USING D/A CONVERTER CIRCUIT

BACKGROUND OF THE INVENTION

1. Field of the Invention

The present invention relates to a method and an apparatus for producing voltages, and more particularly, to a technique for producing a trimmed voltage with enhanced accuracy.

2. Description of the Related Art

These days, any electronic devices have been increasingly demanded to be reduced in size and power consumption. In particular, for example, mobile devices such as cellular phones or portable terminals are required to be reduced in size and enhanced in duration of battery operation. As a result, a demand for internal voltages being produced in the devices with enhanced accuracy has also been increased. Known as a control method for producing an accurate internal voltage is a technique of trimming a voltage by disconnecting a fuse provided internally (e.g., see Japanese Patent Laid-Open Publication No. 2000-150799)

In the aforementioned conventional technique, a fuse connected in parallel to a feedback resistor of an amplifier circuit is disconnected to provide a trimmed output voltage. In this case, a resistance component remaining within the circuit after the disconnection of the fuse would cause variations in the actual output voltage value. Moreover, since the value can be determined only after the fuse has been actually disconnected, it was difficult to improve the accuracy of trimming.

SUMMARY OF THE INVENTION

The inventor has developed the present invention in view of the aforementioned problems. It is therefore an object of the present invention to produce a trimmed voltage with improved accuracy.

An aspect of the present invention provides a voltage generator circuit. This circuit includes a D/A converter circuit which converts an input digital value into an analog value to produce a voltage signal, and a setting circuit which sets the digital value to be supplied to the D/A converter circuit. The setting circuit includes a plurality of fuses which adjust an analog voltage value of the voltage signal to a desired analog voltage value.

In this aspect, the plurality of fuses which adjust the value of the output voltage signal are connected to the D/A converter circuit, such that the plurality of fuses are selectively disconnected to thereby adjust the output from the D/A converter circuit. Unlike the technique of disconnecting the fuse connected in parallel to the feedback resistor of an amplifier circuit, remaining resistance has almost no effects, thereby allowing for enhancing the accuracy of a trimmed voltage.

Another aspect of the present invention also provides a voltage generator circuit. This circuit includes an output circuit which delivers a voltage signal in accordance with an input reference voltage, a D/A converter circuit which converts a digital value into an analog value to thereby produce the reference voltage to be supplied to the output circuit, and a setting circuit which sets the digital value to be supplied to the D/A converter circuit. The setting circuit includes a plurality of fuses which adjust an analog voltage value of the reference voltage to a desired analog voltage value.

For example, the output circuit such as a comparator circuit or an amplifier circuit needs to be supplied with a reference voltage. This aspect allows the voltage generator circuit, which includes the output circuit requiring an input reference voltage, to adjustably trim the reference voltage using the D/A converter circuit. This enables the reference voltage to be produced and utilized with high accuracy.

When a digital value setting provided by the setting circuit is adjusted, the adjusted value may be fixed to a value corresponding to the number of disconnected fuses of the plurality of fuses. That is, the voltage generator circuit according to this aspect adjusts a non-D/A-converted digital value to thereby eliminate the error between an output analog value and a target value. This allows for reducing a variation in value as compared with a direct adjustment of an analog value and thus providing an enhanced adjustment accuracy.

The setting circuit may further include a plurality of switching elements each for providing ON and OFF control to each bit of a digital value. The plurality of switching elements may be each connected in series to any of the plurality of fuses, and turned ON or OFF to simulate the state of each fuse being connected or disconnected. In this case, the turning ON or OFF of the switching elements would simulate an apparent electrical state of a fuse being disconnected, thereby providing a trimmed voltage with enhanced accuracy.

The setting circuit may further include a register which temporarily stores a digital value that provides ON and OFF control to the plurality of switching elements before the fuse is disconnected. This makes it easier to adjust the digital value.

The setting circuit may include fuses, serving as the plurality of fuses, equal in number to the bits of the digital value to be supplied to the D/A converter circuit. Additionally, in the setting circuit, initial values of some bits may be inverted such that an initial digital value available before the plurality of fuses are disconnected takes an intermediate value within a range that can be defined with that number of bits. The number of disconnections of fuses is preferably minimized from the viewpoint of manufacturing costs. Accordingly, minimizing the adjustment range of the digital value would lead to a reduced number of fuse disconnections, thereby making it possible to manufacture the circuit with improved efficiency at reduced costs.

A still another aspect of the present invention provides a method for producing a voltage. This method includes: providing ON and OFF control to a plurality of switching elements corresponding to each bit in accordance with an input digital value; converting the digital value to an analog value in accordance with the ON and OFF control to thereby simulate an apparent analog value to be delivered when a plurality of fuses corresponding to the plurality of switching elements are selectively disconnected; supplying a new digital value adjusted so as to provide a reduced error between the analog value and a target value; and fixing the input digital value by disconnecting a fuse corresponding to the adjusted new digital value.

This aspect allows for providing a trimmed voltage with improved accuracy. Additionally, even before a fuse is actually disconnected, an apparent state of the fuse being disconnected can be simulated by the switching elements being turned ON and OFF. This makes it possible to realize trimming with further enhanced accuracy.

Incidentally, any combinations of the foregoing components, and the expressions of the present invention converted among methods, apparatuses, circuits, and the like are also intended to constitute applicable aspects of the present invention.

The present invention makes it possible to provide a trimmed voltage with enhanced accuracy.

DETAILED DESCRIPTION OF THE INVENTION

A voltage generator circuit according to an embodiment of the present invention produces a desired voltage value with high accuracy using an R-2R ladder resistor network D/A converter circuit and a setting circuit for controlling a switch in the D/A converter circuit.

Figure 1:
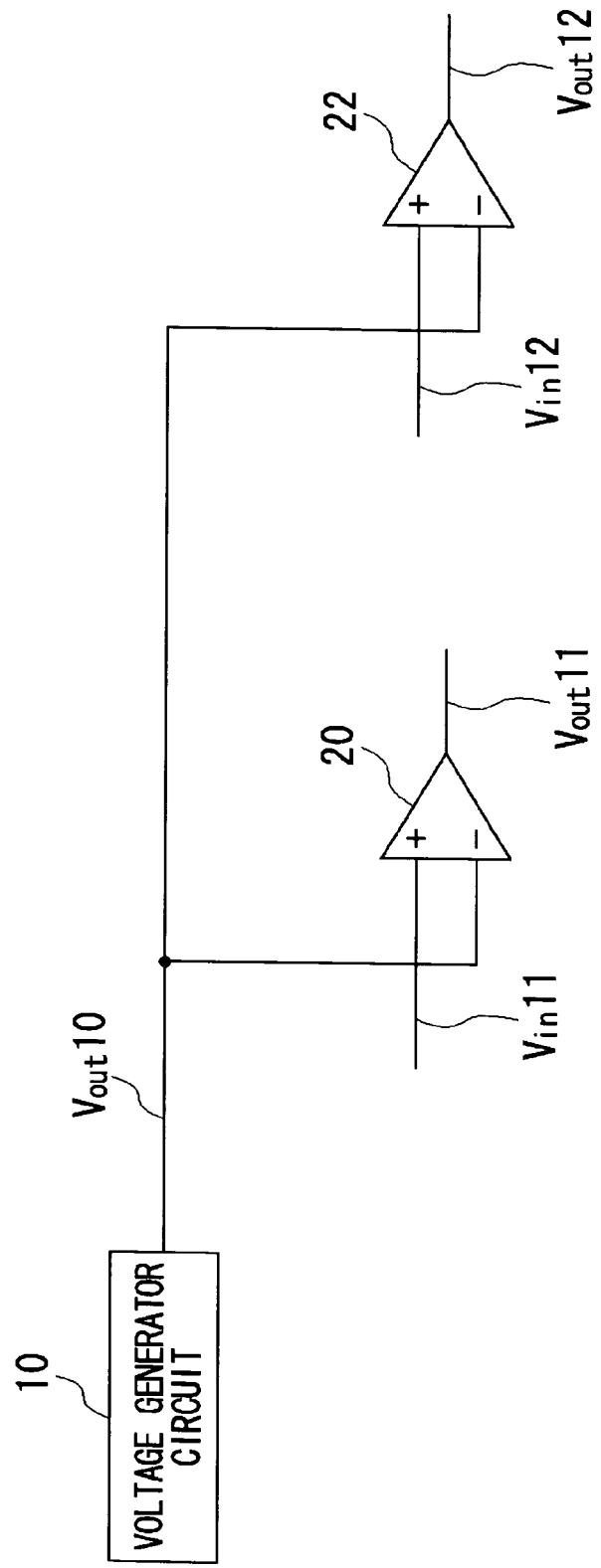
FIG. 1 is a view illustrating the configuration of a voltage generator circuit according to an embodiment and a circuit employing an output from the voltage generator circuit.

FIG. 1 illustrates the configuration of a voltage generator circuit according to this embodiment and a circuit employing an output from the voltage generator circuit. The voltage generator circuit 10 outputs a first voltage signal $V_{out}10$ at a desired voltage value, while a first comparator circuit 20 and a second comparator circuit 22 employ the first voltage signal $V_{out}10$ as a reference voltage. The first comparator circuit 20 compares a first input voltage $V_{in}11$ with the first voltage signal $V_{out}10$ serving as the reference voltage, and outputs the voltage difference therebetween as a second voltage signal $V_{out}11$. The second comparator circuit 22 compares a second input voltage $V_{in}12$ with the first voltage signal $V_{out}10$ serving as the reference voltage, and outputs the voltage difference therebetween as a third voltage signal $V_{out}12$.

The first input voltage $V_{in}11$ and the second input voltage $V_{in}12$ may be a battery voltage. For example, the first and second comparator circuits 20 and 22 would output a signal indicating that the power level of a battery incorporated into an electronic device has got below a predetermined threshold value. In particular, a warning about an insufficient power level of a battery in a portable device has to be issued with a precise timing because the warning would lose one half its meaning as is too early or too late for the actual exhaustion of the battery. For example, to decide on the timing of an insufficient battery power level, it is necessary to measure a voltage difference in the order of 0.01V, in the case of which high accuracy is required of the reference voltage in the device. The voltage generator circuit 10 according to this embodiment allows a voltage employed as the reference voltage to approach a target value with high accuracy.

Figure 2:
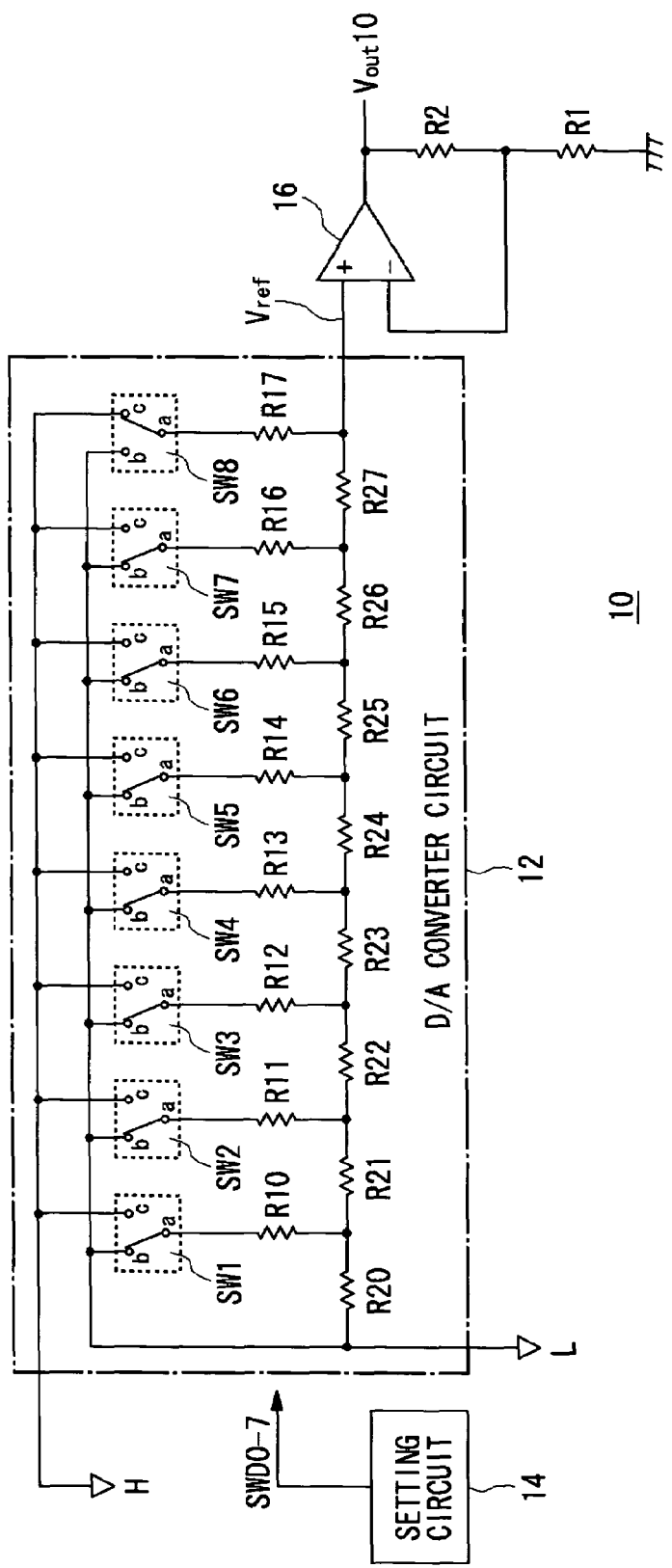
FIG. 2 is a view illustrating the internal configuration of the voltage generator circuit.

FIG. 2 illustrates the internal configuration of the voltage generator circuit 10. The voltage generator circuit 10 mainly includes a D/A converter circuit 12, a setting circuit 14, and an amplifier circuit 16. The D/A converter circuit 12 converts a digital value into an analog value with an 8-bit resolution to output a reference voltage $V_{ref}$. The amplifier circuit 16 amplifies the reference voltage $V_{ref}$ to output the first voltage signal $V_{out}10$. The amplifier circuit 16 is a non-inverting amplifier and has the non-inverting input terminal to which the reference voltage $V_{ref}$ is supplied. A seventeenth load resistor R1 and an eighteenth load resistor R2 are connected in series between the path of the first output voltage signal $V_{out}10$ delivered by the amplifier circuit 16 and the ground, where the first voltage signal $V_{out}10$ is fed back to the non-inverting input terminal of the amplifier circuit 16 via the eighteenth load resistor R2. Therefore, the first voltage signal $V_{out}10$ delivered by the amplifier circuit 16 provides a voltage value of $(1+R2/R1) V_{ref}$. That is, the voltage value of the first voltage signal $V_{out}10$ is determined by the ratio of the eighteenth load resistor R2 to the seventeenth load resistor R1 and the value of the reference voltage $V_{ref}$.

Conventionally, to obtain a desired output voltage value, such a technique has been employed for adjusting the ratio between resistance values in an array of resistors connected to the output of the non-inverting amplifier circuit. More specifically, employed was a trimming method in which a plurality of fuses were each connected in parallel to a plurality of resistors included in the resistor array such that the resistance ratio for the array is determined by the number of disconnected fuses, thereby providing a desired output voltage value. However, in this case, it was difficult to improve the trimming accuracy because a resistance component remaining even after the disconnection of a fuse would readily cause an error in output voltage value, and to be worse, the value can be known only after the fuse was actually disconnected. To be even worse, since 2n fuses would provide repair steps in only n!×2 ways, many fuses had to be prepared to obtain an increased number of repair steps.

The voltage generator circuit 10 according to this embodiment can simulate an apparent electrical state of a fuse being disconnected even before the fuse is actually disconnected, thereby setting an optimum voltage value with ease. Furthermore, since n fuses would provide repair steps in $2^n$ ways, an increased number of repair steps can be obtained even with a less number of fuses.

The D/A converter circuit 12 includes a so-called R-2R type ladder resistor network which is made up of a first load resistor R10, a second load resistor R11, a third load resistor R12, a fourth load resistor R13, a fifth load resistor R14, a sixth load resistor R15, a seventh load resistor R16, an eighth load resistor R17, a ninth load resistor R20, a tenth load resistor R21, an eleventh load resistor R22, a twelfth load resistor R23, a thirteenth load resistor R24, a fourteenth load resistor R25, a fifteenth load resistor R26, and a sixteenth load resistor R27. The first load resistor R10 to the ninth load resistor R20 are equal in resistance value, while the tenth load resistor R21 to the sixteenth load resistor R27 are equal in resistance value. Assuming that the tenth load resistor R21 to the sixteenth load resistor R27 each have a resistance of $R(\Omega)$, the first load resistor R10 to the ninth load resistor R20 each have a resistance of $2R(\Omega)$.

The D/A converter circuit 12 also includes switches for switching each bit of an input digital value between a high level and a low level, such as a first switch circuit SW1, a second switch circuit SW2, a third switch circuit SW3, a fourth switch circuit SW4, a fifth switch circuit SW5, a sixth switch circuit SW6, a seventh switch circuit SW7, and an eighth switch circuit SW8. The first switch circuit SW1 corresponds to the least significant bit, while the eighth switch circuit SW8 corresponds to the most significant bit. Each of the switch circuits includes three contacts "a," "b," and "c."

The eight resistors from the ninth load resistor R20 to the sixteenth load resistor R27 are connected in series in that order to form a resistor array. An end of the ninth load resistor R20 located to the leftmost of the resistor array in FIG. 2 is connected to a low potential L, while an end of the sixteenth load resistor R27 located to the rightmost of the resistor array is connected to the non-inverting input terminal of the amplifier circuit 16. Ends of the first load resistor R10 to the seventh load resistor R16 are connected between the resistors from the ninth load resistor R20 to the sixteenth load resistor R27, respectively, while the other ends are connected to contacts "a" of the first switch circuit SW1 to the seventh switch circuit SW7, respectively. For example, the end of the first load resistor R10 is connected between the ninth load resistor R20 and the tenth load resistor R21, while the end of the seventh load resistor R16 is connected between the fifteenth load resistor R26 and the sixteenth load resistor R27. On the other hand, the end of the eighth load resistor R17 is connected between the sixteenth load resistor R27 and the non-inverting input terminal of the amplifier circuit 16, while the other end is connected to the contact "a" of the eighth switch circuit SW8.

Contacts "b" of the first switch circuit SW1 to the eighth switch circuit SW8 are each connected to the low potential L, while contacts "c" of switch circuit are each connected to a high potential H. In each of the first switch circuit SW1 to the eighth switch circuit SW8, switching of connection between the contacts is performed to switch each bit between the high level and the low level. In this switching operation, connecting the contact "a" to the contact "b" causes the bit to be set to the low level, while connecting the contact "a" to the contact "c" causes the bit to be set to the high level. When set to the low level, the bit provides an output analog value of zero; however, when set to the high level, different bits provide different output analog values. For example, when the contact "a" of the first switch circuit SW1 corresponding to the least significant bit is connected to the contact "c," the eight resistors, i.e., the first load resistor R10 and the tenth load resistor R21 to the sixteenth load resistor R27, are interposed between the contact "a" and the non-inverting input terminal of the amplifier circuit 16. Their total resistance is 9R(Ω).

When the contact "a" of the second switch circuit SW2 corresponding to a bit higher by one than the least significant bit is connected to the contact "c," the seven resistors, i.e., the second load resistor R11 and the eleventh load resistor R22 to the sixteenth load resistor R27, are interposed between the contact "a" and the non-inverting input terminal of the amplifier circuit 16. Their total resistance is 8R(Ω). In this manner, the total resistance is decreased from 9R(Ω) to 2R(Ω) by R(Ω) when the contact "a" of a switch circuit corresponding to each bit from the least significant bit to the most significant bit is connected to the contact "c."

As described above, the D/A converter circuit 12 controls the analog value of the reference voltage $V_{ref}$ to be applied to the non-inverting input terminal of the amplifier circuit 16 based on the contact "a" of each switch circuit corresponding to each bit being connected to either the contact "b" or "c." In this embodiment, the analog value of the reference voltage $V_{ref}$ is adjusted in a 256-step gradation within an allowable voltage value range. Control is provided to switching of connection in each switch circuit using a first switch control signal SWD0 to an eighth switch control signal SWD7 which are delivered from the setting circuit 14.

Of the eight switch circuits from the first switch circuit SW1 to the eighth switch circuit SW8, the seven switch circuits from the first switch circuit SW1 to the seventh switch circuit SW7 each initially connect the contact "a" to the contact "b" to thereby have initially the low level. The eighth switch circuit SW8 connects initially the contact "a" to the contact "c" to thereby have initially the high level.

Therefore, the input digital value takes on an intermediate value of 128, with the initial value of the reference voltage $V_{ref}$ taking on an intermediate value within an allowable voltage value range. This embodiment is designed such that the target value of the reference voltage $V_{ref}$ to be delivered by the D/A converter circuit 12 is set at 1.0V while the allowable voltage value range is defined from 0.9V to 1.1V, with the initial value being set at an intermediate value of 1.0V. Since a plus or minus error about 1.0V may conceivably occur in the output from the D/A converter circuit 12, it is possible to reduce the number of voltage trimming steps and thereby fabricate the circuit at reduced manufacturing costs.

Figure 3:
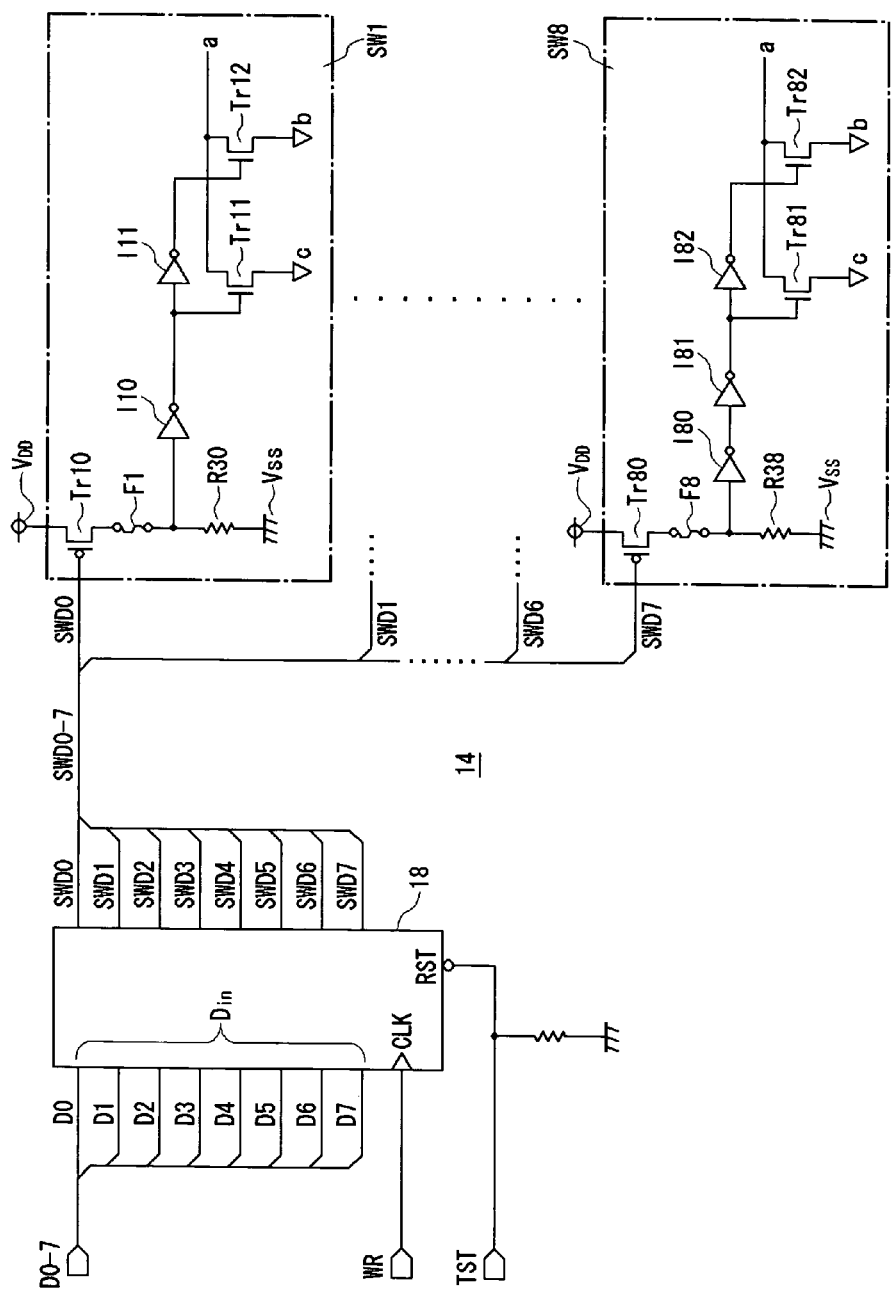
FIG. 3 is a view illustrating the internal configuration of a setting circuit and each switch circuit.

FIG. 3 illustrates the internal configuration of the setting circuit 14 and each switch circuit. In FIG. 13, only the first switch circuit SW1 and the eighth switch circuit SW8 are representative of the first switch circuit SW1 to the eighth switch circuit SW8, with the second switch circuit SW2 to the seventh switch circuit SW7 being not shown. However, the second switch circuit SW2 to the seventh switch circuit SW7 each have the same configuration as that of the first switch circuit SW1.

The first switch circuit SW1 has switching elements such as a first transistor Tr10, a second transistor Tr11, and a third transistor Tr12. The first transistor Tr10 is a p-channel MOS transistor, while the second and third transistors Tr11 and Tr12 are each an n-channel MOS transistor. The first switch circuit SW1 also includes a first fuse F1, a first inverter circuit 110, a second inverter circuit 11, and a resistor R30.

The first transistor Tr10, the first fuse F1, and the resistor R30 are connected in series in that order between a voltage supply $V_{DD}$ and a ground potential $V_{ss}$. The second transistor Tr11 has the drain and the source connected between the contacts "a" and "c," while the third transistor Tr12 has the drain and the source connected between the contacts "a" and "b." The gate of the second transistor Tr11 is connected between the first fuse F1 and the resistor R30 via the first inverter circuit 110, while the gate of the third transistor Tr12 is connected between the first fuse F1 and the resistor R30 via the first inverter circuit 110 and the second inverter circuit I11. That is, the signals supplied to the second transistor Tr11 and the third transistor Tr12 are inverted with respect to each other.

The eighth switch circuit SW8 includes switching elements such as a first transistor Tr80, a second transistor Tr81, and a third transistor Tr82. The first transistor Tr80 is a p-channel MOS transistor, while the second and third transistors Tr81 and Tr82 are each an n-channel MOS transistor. The eighth switch circuit SW8 also includes an eighth fuse F8, a first inverter circuit 180, a second inverter circuit 181, a third inverter circuit 182, and a resistor R38.

The first transistor Tr80, the eighth fuse F8, and the resistor R38 are connected in series in that order between the voltage supply $V_{DD}$ and the ground potential $V_{ss}$. The second transistor Tr81 has the drain and the source connected between the contacts "a" and "c," while the third transistor Tr82 has the drain and the source connected between the contacts "a" and "b." The gate of the second transistor Tr81 is connected between the eighth fuse F8 and the resistor R38 via the first inverter circuit 180 and the second inverter circuit 181, while the gate of the third transistor Tr82 is connected between the eighth fuse F8 and the resistor R38 via the first, the second, and the third inverter circuits 180, 181, and 182. That is, the signals supplied to the second transistor Tr81 and the third transistor Tr82 are inverted with respect to each other.

The gates of the first transistor Tr10 in the first switch circuit SW1, the transistors included in the respective second switch circuit SW2 to the seventh switch circuit SW7 (not shown), and the first transistor Tr80 in the eighth switch circuit SW8 are supplied with the control signals, i.e., the first switch control signal SWD0 to the eighth switch control signal SWD7, respectively. The first switch control signal SWD0 to the eighth switch control signal SWD7 have initially the low level, causing each of the first transistor Tr10 to the first transistor Tr80 included in the first switch circuit SW1 to the eighth switch circuit SW8 to be turned ON.

In the first switch circuit SW1, the source to drain voltage of the first transistor Tr10 is at the high level, the voltage being inverted in the first inverter circuit 110 causing the second transistor Tr11 to be turned OFF and further inverted in the second inverter circuit I11 causing the third transistor Tr12 to be turned ON. Accordingly, the contact "a" of the first switch circuit SW1 is initially connected to the contact "b." Like the first switch circuit SW1, the contacts "a" of the second switch circuit SW2 to the seventh switch circuit SW7 are also initially connected to the respective contacts "b."

In the eighth switch circuit SW8, the source to drain voltage of the first transistor Tr80 is at the high level, the voltage being inverted twice in the first inverter circuit 180 and the second inverter circuit 181 causing the second transistor Tr81 to be turned ON and further inverted in the third inverter circuit 182 causing the third transistor Tr82 to be turned OFF. Accordingly, the contact "a" of the eighth switch circuit SW8 is initially connected to the contact "c."

As described above, when the first switch control signal SWD0 to the eighth switch control signal SWD7 each have the low level, the contacts "a" of the first switch circuit SW1 to the seventh switch circuit SW7 are connected to the respective contacts "b" with the contact "a" of the eighth switch circuit SW8 connected to the contact "c." Conversely, when the first switch control signal SWD0 to the eighth switch control signal SWD7 each have the high level, the contacts "a" of the first switch circuit SW1 to the seventh switch circuit SW7 are connected to the respective contacts "c" with the contact "a" of the eighth switch circuit SW8 connected to the contact "b."

When the first fuse F1 to the eighth fuse F8 included in the first switch circuit SW1 to the eighth switch circuit SW8 are disconnected, each of the first transistor Tr10 to the first transistor Tr80 is fixedly turned OFF. In other words, making each of the first transistor Tr10 to the first transistor Tr80 turned OFF can simulate an electrical state of each of the first fuse F1 to the eighth fuse F8 being disconnected. Realizing this state before each fuse is actually disconnected allows to perform voltage trimming while the voltage value is being measured with accuracy, thereby providing improved trimming accuracy.

A register 18 receives at $D_{in}$ an 8-bit digital value of a first input signal D0 to an eighth input signal D7 together with a write signal WR, and stores the received signals temporarily. When a test signal TST is supplied to the register 18, the values stored in the register 18 are sequentially read out as the values for the first switch control signal SWD0 to the eighth switch control signal SWD7 and then supplied to the first switch circuit SW1 to the eighth switch circuit SW8.

Now, the process procedure will be described which is realized by the configuration described above. First, before a fuse is disconnected, a measurement is made on the initial value of the reference voltage $V_{ref}$ delivered by the D/A converter circuit 12. When an error is found between the measured voltage value and the target value, a new digital value adjusted to eliminate the error is supplied to the register 18. In this manner, adjustments are repeated until no error is found between the voltage value of the new reference voltage $V_{ref}$ and the target value. After the adjustments, the fuse is disconnected which is included in the switch circuit corresponding to the bit that has been adjusted to a value different from the initial value. This allows the switch circuit to be fixed to the adjusted value. Disconnecting the fuses arranged as shown in FIG. 3 would cause almost no resistance components to remain, thus making it possible to improve voltage trimming accuracy.

As can be seen from the above description, the fuse corresponding to a bit which can be left with the initial value is not disconnected, whereas the fuse associated with a bit whose initial value is to be changed is disconnected to provide an inverted value. The number of fuses is the same as the number of bits of a digital value supplied to the D/A converter circuit 12. However, since n fuses would provide repair steps in $2^n$ ways, a less number of fuses can provide a larger number of repair steps as compared with the conventional technique, with the interval between the steps being reduced.

This embodiment allows the setting circuit 14 to set a digital value, thereby realizing an inexpensive circuit as compared with the case of employing a non-volatile memory such as EEPROMs.

Hereinbefore, the present invention has been described in accordance with the embodiment. The embodiment has been given solely by way of illustration. It will be understood by those skilled in the art that various modifications may be made to combinations of the foregoing components and processes, and all such modifications are also intended to fall within the scope of the present invention. Now, some modified examples are listed below.

The D/A converter circuit 12 according to this embodiment employs an R-2R ladder resistor network type circuit; however, a modified example may also employ a D/A converter circuit of another type. Even in this modified example, the setting circuit 14 according to this embodiment can also be employed to provide the same effects.

Furthermore, the voltage generator circuit 10 according to this embodiment is configured to include the amplifier circuit 16 installed inside the circuit as shown in FIG. 2. However, the voltage generator circuit 10 according to a modified example may not include the amplifier circuit 16 therein, but may include the first comparator circuit 20 of FIG. 1 or the second comparator circuit 22 instead of the amplifier circuit 16. These configurations also provide the same effects as this embodiment.

What is claimed is:
1. A voltage generator circuit comprising:
a D/A converter circuit which converts an input digital value into an analog value to produce a voltage signal; and
a setting circuit which sets the digital value to be supplied to the D/A converter circuit, the setting circuit including:
a plurality of fuses which adjust an analog voltage value of the voltage signal to a desired analog voltage value;
a plurality of switching elements each for providing ON and OFF control to each bit of the digital value; and
a register which temporarily stores a digital value that provides ON and OFF control to the plurality of switching elements before the fuse is disconnected; wherein the plurality of switching elements are each connected in series to any of the plurality of fuses; and turned ON or OFF to simulate a state of each fuse being connected or disconnected.

2. A voltage generator circuit comprising:
an output circuit which delivers a voltage signal in accordance with an input reference voltage;
a D/A converter circuit which converts a digital value into an analog value to thereby produce the reference voltage to be supplied to the output circuit; and
a setting circuit which sets the digital value to be supplied to the D/A converter circuit, the setting circuit including:
a plurality of fuses which adjust an analog voltage value of the reference voltage to a desired analog voltage value;
a plurality of switching elements each for providing ON and OFF control to each bit of the digital value;
a register which temporarily stores a digital value that provides ON and OFF control to the plurality of switching elements before the fuse is disconnected; wherein
the plurality of switching elements are each connected in series to any of the plurality of fuses, and turned ON or OFF to simulate a state of each fuse being connected or disconnected.

3. The voltage generator circuit according to claim 1, wherein
when a digital value setting provided by the setting circuit is adjusted, the adjusted value is fixed to a value corresponding to the number of disconnected fuses of the plurality of fuses.

4. The voltage generator circuit according to claim 2, wherein
when a digital value setting provided by the setting circuit is adjusted, the adjusted value is fixed to a value corresponding to the number of disconnected fuses of the plurality of fuses.

5. The voltage generator circuit according to claim 1, wherein
the setting circuit includes fuses, serving as the plurality of fuses, equal in number to the bits of the digital value to be supplied to the D/A converter circuit, and initial values of some bits are inverted such that an initial digital value available before the plurality of fuses are disconnected takes an intermediate value within a range that can be defined with that number of bits.

6. The voltage generator circuit according to claim 2, wherein
the setting circuit includes fuses, serving as the plurality of fuses, equal in number to the bits of the digital value to be supplied to the D/A converter circuit, and initial values of some bits are inverted such that an initial digital value available before the plurality of fuses are disconnected takes an intermediate value within a range that can be defined with that number of bits.

7. The voltage generator circuit according to claim 3, wherein
the setting circuit includes fuses, serving as the plurality of fuses, equal in number to the bits of the digital value to be supplied to the D/A converter circuit, and initial values of some bits are inverted such that an initial digital value available before the plurality of fuses are disconnected takes an intermediate value within a range that can be defined with that number of bits.

8. The voltage generator circuit according to claim 4, wherein
the setting circuit includes fuses, serving as the plurality of fuses, equal in number to the bits of the digital value to be supplied to the D/A converter circuit, and initial values of some bits are inverted such that an initial digital value available before the plurality of fuses are disconnected takes an intermediate value within a range that can be defined with that number of bits.

9. A method for producing a voltage, comprising:
storing temporarily a digital value, to be supplied to a D/A converter circuit, to a register;
reading out each bit value of the digital value from the register;
providing ON and OFF control to a plurality of switching elements corresponding to each bit in accordance with the each bit value being read out;
converting the digital value to an analog value in accordance with the ON and OFF control to thereby simulate an apparent analog value to be delivered when a plurality of fuses corresponding to the plurality of switching elements are selectively disconnected;
supplying a new digital value adjusted so as to provide a reduced error between the analog value and a target value; and
fixing the input digital value by disconnecting a fuse corresponding to the adjusted new digital value.

* * * * *